United States Patent [19]

Ogihara

[11] Patent Number: 5,619,162

[45] Date of Patent: *Apr. 8, 1997

[54] DRAM USING WORD LINE POTENTIAL CIRCUIT CONTROL

[75] Inventor: Masaki Ogihara, Yokohama, Japan

[73] Assignee: Kabushiki Kaisha Toshiba, Kawasaki, Japan

[*] Notice: The term of this patent shall not extend beyond the expiration date of Pat. No. 5,335,205.

[21] Appl. No.: 658,572

[22] Filed: Jun. 5, 1996

Related U.S. Application Data

[62] Division of Ser. No. 240,368, May 10, 1994, Pat. No. 5,550,504, which is a division of Ser. No. 757,632, Sep. 11, 1991, Pat. No. 5,335,205.

[30] Foreign Application Priority Data

Sep. 12, 1990 [JP] Japan ................... 2-239893

[51] Int. Cl.$^6$ ................. G05F 3/16; G11C 7/00
[52] U.S. Cl. ................. 327/537; 327/543; 326/88; 365/230.06; 365/189.09
[58] Field of Search ............. 365/230.06, 189.09; 326/105, 106, 107, 108, 81, 83, 121; 327/537, 543, 437

[56] References Cited

U.S. PATENT DOCUMENTS

| | | | |
|---|---|---|---|
| 4,651,031 | 3/1987 | Kamuro | 307/449 |
| 4,737,936 | 4/1988 | Takeuchi | 365/189.09 |
| 4,769,792 | 9/1988 | Nogami et al. | 365/222 |
| 4,820,941 | 4/1989 | Dolby et al. | 307/449 |
| 4,893,275 | 1/1990 | Tanaka et al. | 365/189.09 |
| 4,988,894 | 1/1991 | Takiba et al. | 327/437 |
| 5,065,361 | 11/1991 | Yoshizawa et al. | 365/104 |
| 5,119,334 | 6/1992 | Fujii | 365/230.06 |
| 5,136,190 | 8/1992 | Chern et al. | 307/475 |

FOREIGN PATENT DOCUMENTS

| | | |
|---|---|---|
| 0092809 | 11/1983 | European Pat. Off. . |
| 0212946 | 3/1987 | European Pat. Off. . |
| 4117967 | 12/1991 | Germany ........... 365/230.06 |
| 52-71141 | 6/1977 | Japan ............. 365/230.06 |
| 58-188388 | 11/1983 | Japan . |

OTHER PUBLICATIONS

Gillingham et al., "High–Speed, High–Reliability Circuit Design For Megabit DRAM", IEEE Journal of Solid–State Circuits, vol. 26, No. 8, Aug. 1991, pp. 1171–1175.

Kitsukawa et al., "A 23–ns 1–Mb BiCMOS DRAM", IEEE Journal of Solid–State Circuits, vol. 25, No. 5, Oct. 1990, pp. 1102–1109.

*Primary Examiner*—David C. Nelms
*Assistant Examiner*—Andrew Q. Tran
*Attorney, Agent, or Firm*—Banner & Witcoff, Ltd.

[57] ABSTRACT

Memory cells including at least one memory cell having an n-channel MOS transistor and an n-channel MOS capacitor. A word line is connected to the memory cells. A word line drive circuit for driving the word line includes a p-channel MOS for transferring a potential to the word line. The word line drive circuit is controlled by a output from a word line potential control circuit. The word line potential control circuit applies a power source potential to the word line through the current path of the p-channel MOS transistor in the word line drive circuit when the memory cells are not selected, and the word line potential control circuit applies a potential higher than a potential obtained by adding a threshold voltage of the n-channel MOS transistor to the power source potential to the word line through the current path of the p-channel MOS transistor in the word line drive circuit when the memory cells are selected.

4 Claims, 11 Drawing Sheets

DRAM USING WORD LINE POTENTIAL CIRCUIT CONTROL

This application is a division of application Ser. No. 08/240,368, filed May 10, 1994, now U.S. Pat No. 5,550,504 which is a division of application Ser. No. 07/757,632, filed Sep. 11, 1991 now U.S. Pat No. 5,335,205.

BACKGROUND OF THE INVENTION

1. Field of the Invention

The present invention relates a semiconductor memory device using a word line drive circuit system and, more particularly, to a DRAM (Dynamic Random Access Memory) capable of increasing an access speed.

2. Description of the Related Art

In a DRAM, as in other semiconductor memory devices, a memory address of data is designated by a row address signal and a column address signal. In general, the row and column address signals are serially input to a chip in a time division mode using the same input pin. For this reason, in order to check whether an address signal input from the address input pin is the row address signal or the column address signal, an $\overline{RAS}$ (Row Address Strobe) signal and a $\overline{CAS}$ (Column Address Strobe) signal are used.

In recent years, as an operating speed of a DRAM is increased, a key point for increasing an access speed is a decrease in time from when the $\overline{RAS}$ signal falls and the potential of a word line rises to when a memory cell is selected.

Figure 1:
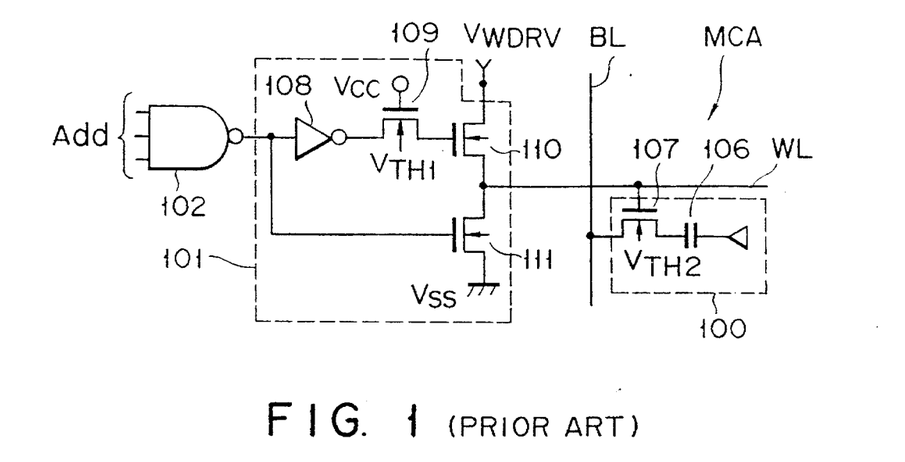
FIG. 1 is a circuit diagram showing a memory cell, a row decoder, and a word line drive circuit in a conventional semiconductor memory device using a word line drive circuit system wherein one memory cell is emphasized in a memory cell array.

FIG. 1 shows a memory cell, a row decoder, and a word line drive circuit in a conventional DRAM wherein one memory cell is emphasized in a memory cell array MCA. A row address signal Add is supplied to a NAND circuit 102 serving as a part of a row decoder. An output signal from the NAND circuit 102 is supplied to a word line drive circuit 101. The word line drive circuit 101 is constituted by an inverter 108 and n-channel MOS transistors 109, 110, and 111. The input terminal of the inverter 108 is connected to the output terminal of the NAND circuit 102 and inverts an output signal from the NAND circuit 102. One end of the current path of the MOS transistor 109 is connected to the output terminal of the inverter 108, the other end is connected to the gate of the MOS transistor 110, and the gate of the MOS transistor 109 is connected to a power source Vcc. One end of the current path of the MOS transistor 110 is connected to receive a potential $V_{WDRV}$, and the other end is connected to one end of the current path of the MOS transistor 111. The other end of the current path of the MOS transistor 111 is connected to a ground point Vss, and the gate of the MOS transistor 111 is connected to the output terminal of the NAND circuit 102. The connection point between the current paths of the MOS transistors 110 and 111 is connected to a word line WL. In the word line drive circuit 101, the MOS transistor 110 serves as a transistor for driving the word line WL.

A memory cell 100 is constituted by an n-channel MOS capacitor 106 and an n-channel MOS transistor 107 serving as a transfer gate. One end of the current path of the MOS transistor 107 is connected to a bit line BL, the other end is connected to one electrode of the MOS capacitor 106, and the gate of the MOS transistor 107 is connected to the word line WL. A reference potential such as a ground potential is applied to the other electrode of the MOS capacitor 106.

An operation of the circuit shown in FIG. 1 will be described below with reference to a timing chart of FIG. 2.

Figure 2:
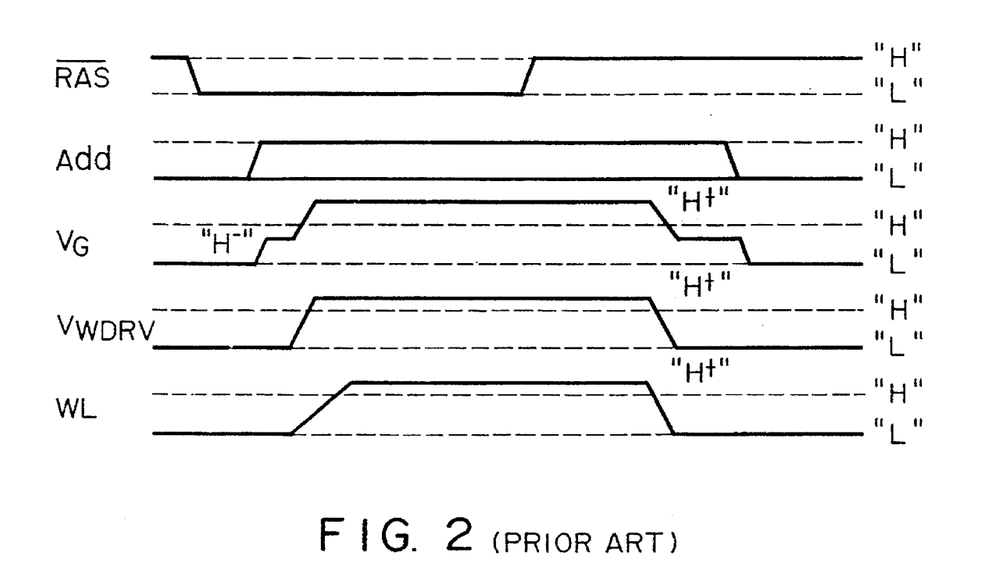
FIG. 2 is a timing chart of signals in the circuit shown in FIG. 1.

FIG. 2 is the timing chart of the signals in the circuit shown in FIG. 1. When an $\overline{RAS}$ signal input from the outside of a chip falls, i.e., goes to low level ("L" level), an address signal input from an address pin at this time is recognized as the row address signal Add. A row of memory cells in a memory cell array MCA is designated and selected by this row address signal. At this time, assuming that the threshold voltage of the MOS transistor 109 is set to be $V_{TH1}$ and that a power source voltage is set to be Vcc, a gate potential $V_G$ of the MOS transistor 110 for driving the word line WL becomes "Vcc–$V_{TH1}$" (to be referred to as "H$^-$" level hereinafter). The potential $V_{WDRV}$ applied to one end of the current path of the MOS transistor 110 is increased from Vss to "Vcc+$V_{TH2}$" ($V_{TH2}$ is a threshold voltage of the MOS transistor 107) or more. When the potential $V_{WDRV}$ is to be increased, the gate potential $V_G$ of the MOS transistor 110 is increased to a high potential by capacitive coupling of a parasitic capacitance between the source and gate. As a result, a potential (to be referred to as "H$^+$" level hereinafter) equal to or higher than "Vcc+$V_{TH2}$" is transferred to the word line WL. As described above, the potential at "H$^+$" level equal to or higher than the power source potential Vcc is applied to the word line WL, because a voltage applied to the capacitor 106 in the memory cell 100 must be reliably set at Vcc level.

However, the circuit system shown in FIG. 1 has the following drawbacks.

First, before the gate potential $V_G$ of the word line drive transistor 110 goes to "H$^-$" level, when the potential $V_{WDRV}$ applied to one end of the current path of the transistor 110 begins to increase, it may be impossible to increase the potential of the word line WL to "H$^+$" level. For this reason, a sufficient time margin is required from the leading edge of the potential. $V_{WDRV}$ after the $\overline{RAS}$ signal rises, thereby limiting a high speed operation.

Secondly, when the potential $V_{WDRV}$ is to be increased, since the gate potential $V_G$ of the word line drive transistor 110 is increased by capacitive coupling of a parasitic capacitance between the source and gate of the transistor 110, a potential difference between the source and gate is small. A time from when the potential of the word line WL begins to increase to when the potential reaches "H$^+$" level is long.

Figure 3:
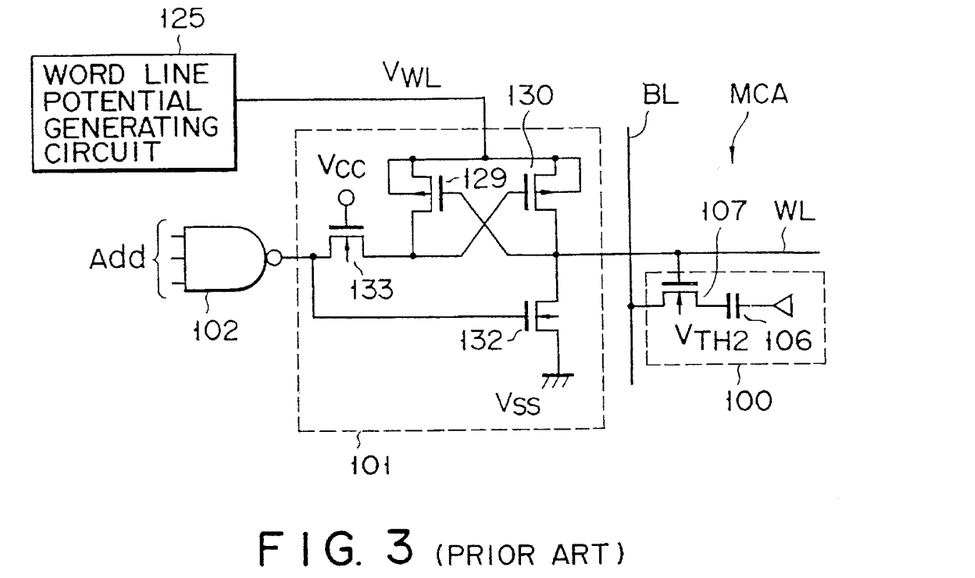
FIG. 3 is a circuit diagram showing a memory cell, a row decoder, and a word line drive circuit in another conventional semiconductor memory device using a word line drive circuit system wherein one memory cell is emphasized in a memory cell array.

In order to solve the above problems, a well-known circuit having a word line drive transistor constituted by a p-channel MOS transistor is shown in FIG. 3.

The word line drive circuit 101 is constituted by n-channel MOS transistors 132 and 133 and p-channel MOS transistors 129 and 130 for driving a word line WL. One end of the current path of the MOS transistor 133 is connected to the output terminal of the NAND circuit 102, the other end is connected to one end of the current path of the MOS transistor 129 and the gate of the MOS transistor 130, and the gate of the MOS transistor 133 is connected to the Dower source Vcc. The gate of the MOS transistor 129 is connected to one end of the current path of the MOS transistor 130. The current path of the MOS transistor 132 is connected between one end of the current path of the MOS transistor 130 and the ground point Vss, and the gate of the MOS transistor 132 is connected to the output terminal of the NAND circuit 102. The connection point between the current paths of the MOS transistors 130 and 132 is connected to the word line WL. The other end of each of the current paths and back gates of the MOS transistors 129 and 130 are connected to the output terminal of a word line potential generating circuit 125 and receive a potential $V_{WL}$. Assuming that the threshold voltage of the transfer gate transistor 107 in the memory cell 100 is set to be $V_{TH2}$, the potential $V_{WL}$ is set to be a constant potential ("H+" level) equal to or higher than "Vcc+$V_{TH2}$".

Figure 4:
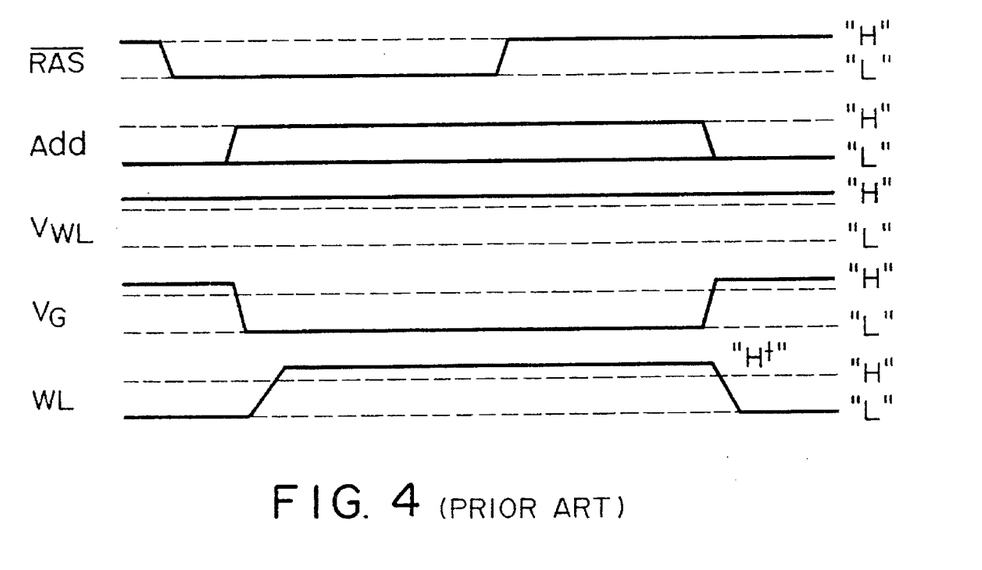
FIG. 4 is a timing chart of signals in the circuit shown in FIG. 3.

An operation of the circuit shown in FIG. 3 will be described with reference to a timing chart of FIG. 4. When the $\overline{RAS}$ signal falls to "L" level, an input address signal is recognized as the row address signal Add, and an output from the NAND circuit 102 goes to "L" level. As a result, the gate potential $V_G$ of the MOS transistor 130 goes to "L" level, and the MOS transistor 130 is turned on. At this time, when the output from NAND circuit 102 goes to "L" level, the MOS transistor 132 is turned off. Since the word line potential $V_{WL}$ as a high potential is always applied from the word line potential generating circuit 125 to the MOS transistor 130, the potential of the word line WL is increased to the potential $V_{WL}$, thereby turning off the MOS transistor 129.

As described above, in the circuit shown in FIG. 3, since the potential of the word line WL can be increased to a sufficiently high potential only by recognizing the row address signal Add, an access operation is performed at a speed higher than that of an arrangement using the circuit of FIG. 1. However, the circuit system shown in FIG. 3 has the following problems.

In general, the following fact is known. That is, when a high electric field of 4 to 6 MV/cm or more is applied to the source-gate or drain-gate path of a MOS element, a gate oxide film is heavily damaged, and long-time reliability of the MOS element is remarkably degraded. At present, as the MOS element is micropatterned, a gate oxide film tends to be thin. For this reason, in order to assure the long-time reliability of the gate oxide film, it is attempted to decrease a power source voltage of an LSI (Large Scale Integrated circuit) itself.

The feature of the circuit shown in FIG. 3 is described as follows. As described above, the high voltage $V_{WL}$ ("H+" level) is always applied to the sources of the word line drive transistors 129 and 130 by the generating circuit 125 for generating the potential $V_{WL}$ for the word line WL. For this reason, the gate oxide films of the MOS transistors 129 and 130 are heavily damaged compared with that of the circuit shown in FIG. 1, and the long-time reliability of the element cannot easily obtained.

SUMMARY OF THE INVENTION

It is, therefore, the first object of the present invention to provide a semiconductor memory device using a word line drive circuit system capable of selecting a word line at a high speed without degradation of the long-time reliability of a gate oxide film.

It is the second object of the present invention to provide a signal control circuit which has a relatively simple circuit arrangement and can control the potential of a signal line for receiving first and second potentials.

in order to achieve the first object, according to the present invention, there is provided a semiconductor memory device comprising memory cells including at least one memory cell having a MOS transistor of a first conductivity type and a MOS capacitor of the first conductivity type, a word line connected to the memory cells, a word line drive circuit which includes a MOS transistor of a second conductivity type for transferring a potential to the word line and drives the word line, and a word line potential control circuit in which a first potential is applied to the word line drive circuit when the memory cells are not selected and a second potential different from the first potential is applied to the word line drive circuit when the memory cells are selected.

With the above arrangement, a potential difference of the source-drain or source-gate path of the MOS transistor of the word line drive circuit for transferring a potential to the word line can be smaller in a nonselected state of the memory cells than in a selected state of the memory cells. Therefore, degradation of the gate oxide film of the MOS transistor can be prevented.

In order to achieve the second object, according to the present invention, there is provided a signal control circuit comprising a signal line for receiving a first potential and a second potential obtained by boosting the first potential, a first MOS transistor of a first conductivity type having one end of a current path and a back gate connected to the signal line and a gate for receiving an input signal, a second MOS transistor of a second conductivity type having one end of a current path electrically connected to the other end of the current path of the first MOS transistor, the other end of the current path connected to a first potential supply source, and a gate for receiving the input signal, and a third MOS transistor of the second conductivity type having one end of a current path and a back gate electrically connected to the signal line, the other end of the current path connected to a second potential supply source, and a gate connected to a connection point between the current paths of the first and second MOS transistors.

With the above arrangement, there is provided a signal control circuit which can control the potential of the signal line for receiving the first and second potentials with a small number of elements (basically, three MOS transistors).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A semiconductor memory device according to the first embodiment of the present invention will be described below with reference to FIGS. 5 and 6.

Figure 5:
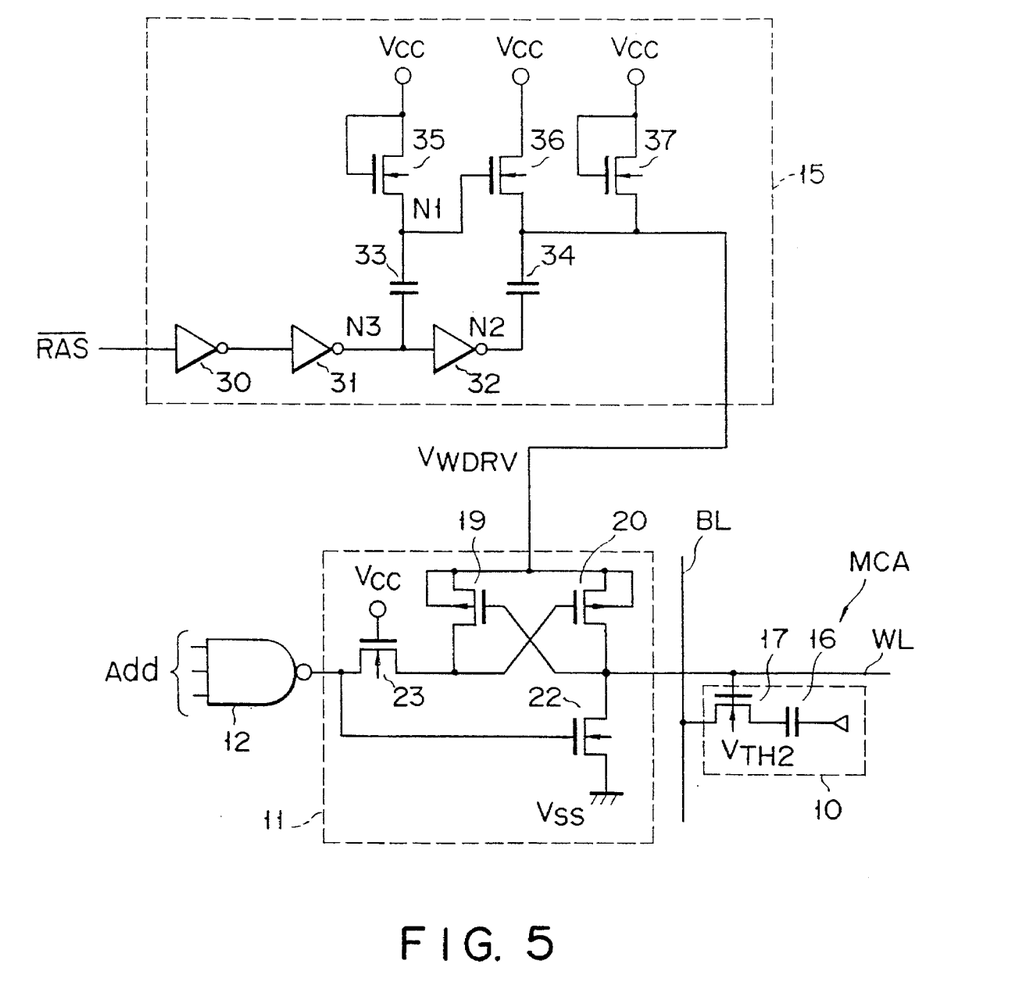
FIG. 5 is a circuit diagram showing a memory cell, a row decoder, and a word line drive circuit in a semiconductor memory device using a word line drive circuit system according to the first embodiment of the present invention wherein one memory cell is emphasized in a memory cell array.

A memory cell, a row decoder, and a word line drive circuit in a DRAM having a word line drive circuit are shown in FIG. 5 wherein a memory cell 10 is emphasized in a memory cell array MCA. A row address signal Add is supplied to a NAND circuit 12 serving as a part of a row decoder. The row address signal Add is not a row address signal input to an address pin of a chip. An output signal from the NAND circuit 12 is supplied to a word line drive circuit 11. The word line drive circuit 11 is constituted by n-channel MOS transistors 22 and 23 and word line drive p-channel MOS transistors 19 and 20. One end of the current path of the MOS transistor 23 is connected to the output terminal of the NAND circuit 12, the other end is connected to the drain of the MOS transistor 19 and the gate of the MOS transistor 20, and the gate of the MOS transistor 23 is connected to a power source Vcc. The gate of the MOS transistor 19 is connected to the drain of the MOS transistor 20. The drain-source path of the MOS transistor 22 is connected between the drain of the MOS transistor 20 and a ground point Vss, and the gate of the MOS transistor 22 is connected to the output terminal of the NAND circuit 12. The common connection point of the MOS transistors 20 and 22 is connected to a word line WL. The sources and back gates of the MOS transistors 19 and 20 are connected to the output terminal of a word line potential control circuit 15 and applied with a potential $V_{WDRV}$.

The memory cell 10 is constituted by an n-channel MOS capacitor 16 and an n-channel MOS transistor 17 serving as a transfer gate. One end of the current path of the MOS transistor 17 is connected to a bit line BL, the other end is connected to one electrode of the MOS capacitor 16, and the gate of the MOS transistor 17 is connected to the word line WL. A reference potential such as a ground potential is applied to the other electrode of the MOS capacitor 16.

The word line potential control circuit 15 is arranged for controlling the source potential $V_{WDRV}$ of the p-channel MOS transistors 19 and 20 serving as word line drive transistors. When the word line WL is selected, the potential $V_{WDRV}$ higher than sum of the power source Vcc and a threshold voltage $V_{TH2}$ is applied to the sources of the word line drive transistors 19 and 20 by the word line potential control circuit 15. When the word line WL is not selected, the potential $V_{WDRV}$ is set at Vcc level.

The word line potential control circuit 15 is constituted by inverters 30, 31, and 32, capacitors 33 and 34, and n-channel MOS transistors 35, 36, and 37. An $\overline{RAS}$ signal is supplied to the input terminal of the inverter 30. The output terminal of the inverter 30 is connected to the input terminal of the inverter 31, and the output terminal of the inverter 31 is connected to the input terminal of the inverter 32 and one electrode of the capacitor 33. The output terminal of the inverter 32 is connected to one electrode of the capacitor 34. The current path of the MOS transistor 35 is connected between the other electrode of the capacitor 33 and the power source Vcc, and the gate of the MOS transistor 35 is connected to the power source Vcc. The current path of the MOS transistor 36 is connected between the other electrode of the capacitor 34 and the power source Vcc, and the gate of the MOS transistor 36 is connected to a connection node N1 between the other electrode of the capacitor 33 and the current path of the MOS transistor 35. The current path of the MOS transistor 37 is connected between the other electrode of the capacitor 34 and the power source Vcc, and the gate of the MOS transistor 37 is connected to the power source Vcc. Connection nodes between the other electrode of the capacitor and the MOS transistors 36 and 37 are connected to the sources and back gates of the word drive transistors 19 and 20.

Figure 6:
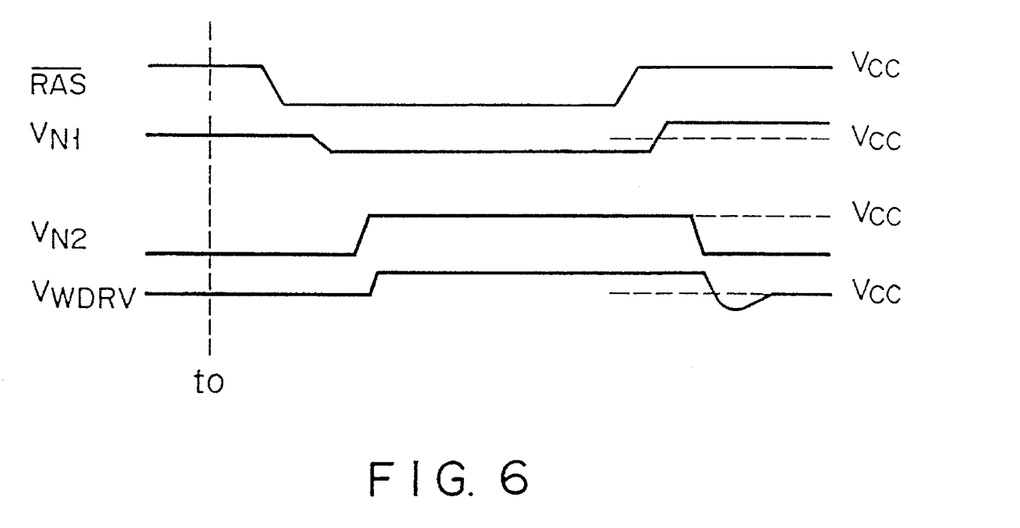
FIG. 6 is a timing chart for explaining an operation of the circuit shown in FIG. 5.

FIG. 6 is a timing chart for explaining an operation of the word line potential control circuit 15 in the circuit shown in FIG. 5, and the timing chart shows the signals and the potentials of nodes. In a precharge state at time t0, since a potential $V_{N1}$ of the node N1 connected to the gate of the MOS transistor 36 is set in a condition of $V_{N1} \geq Vcc+V_{TH3}$ ($V_{TH3}$ is the threshold 10 voltage of the MOS transistor 36), the MOS transistors 36 and 37 are set in an ON state, and the output potential $V_{WDRV}$ goes to Vcc level. When the $\overline{RAS}$ signal is decreased to "L" level, the potential at the output terminal of the inverter 30 goes to "H" level and the potential of the output terminal N3 of the inverter 31 goes to "L" level. As a result, the gate potential $V_{N1}$ of the MOS transistor 36 is decreased by capacitive coupling of the capacitor 33, and the transistor 36 is turned off. A potential $V_{N2}$ of an output terminal N2 of the inverter 32 is increased, and the output potential $V_{WDRV}$ is set in a condition of $V_{WDRV} \geq Vcc+V_{TH2}$ by capacitive coupling of the capacitor 34. When the $\overline{RAS}$ signal is increased to "H" level, a potential $V_{N3}$ of the output terminal N3 of the inverter 31 is increased and set in a condition of $V_{N3} \geq Vcc+V_{TH3}$ by the capacitive coupling of the capacitor 33. As a result, the MOS transistor 36 is turned on. In contrast to this, the potential $V_{N2}$ of the output terminal N2 is decreased, and the output potential $V_{WDRV}$ is decreased to Vcc level by the capacitive coupling of the capacitor 34. At this time, although the output potential $V_{WDRV}$ is temporarily undershot in a condition of $V_{WDRV}$<Vcc by the capacitive coupling of the capacitor 34, the output potential $V_{WDRV}$ is returned to Vcc level by turning on the MOS transistors 36 and 37.

with the above arrangement, when the $\overline{RAS}$ signal is set at "L" level (i.e., when any memory cell in the memory cell array MCA is accessed), the voltage $V_{WDRV} \geq Vcc+V_{TH2}$ is applied to the sources and back gates of the MOS transistors 19 and 20. When the $\overline{RAS}$ signal is set at "H" level (when any memory cell in the memory cell array MCA is not accessed), the potential of the power source Vcc can be applied to the sources and the back gates of the MOS transistors 19 and 20. Therefore, a time for applying a high electric field to the gate oxide film of the word line drive transistors 19 and 20 can be minimized, and degradation of the gate oxide film can be prevented.

Figure 7:
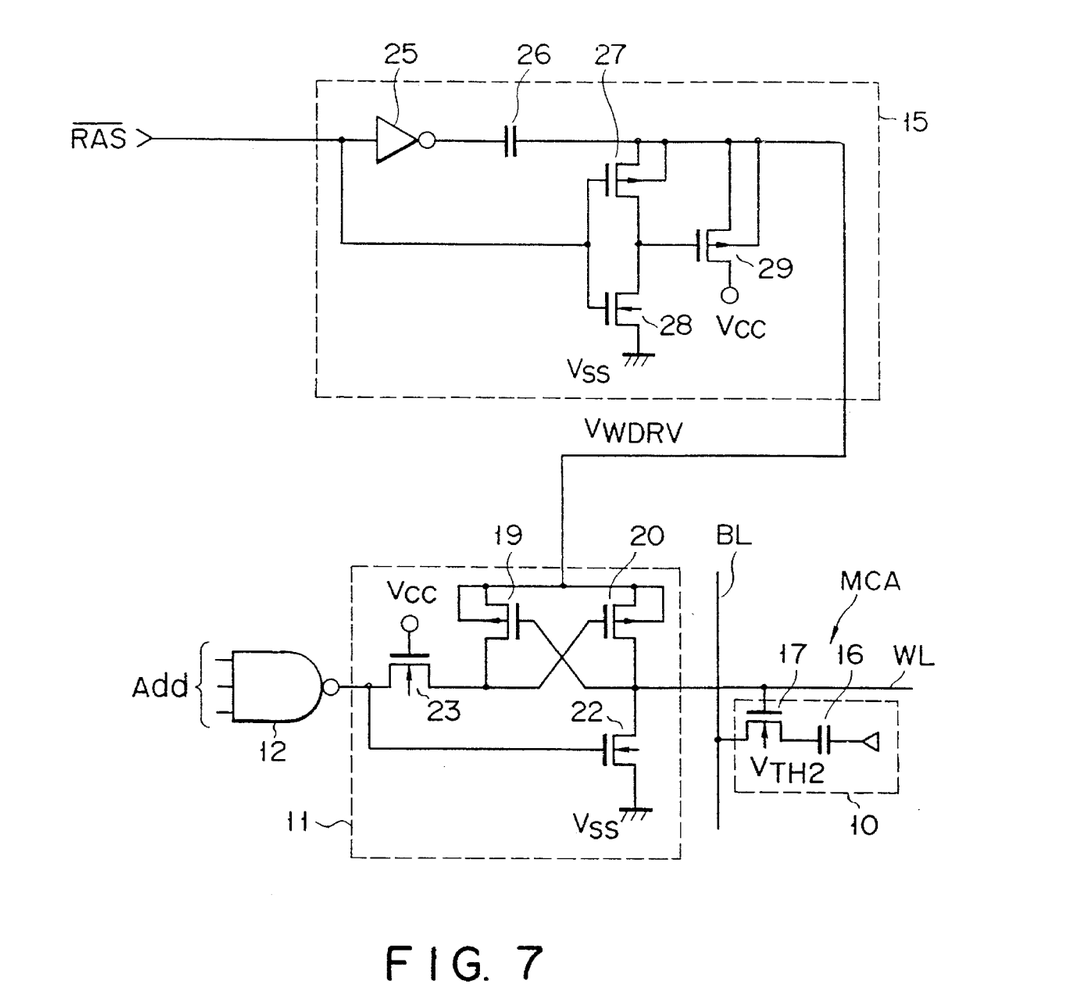
FIG. 7 is a circuit diagram showing a memory cell, a row decoder, and a word line drive circuit in a semiconductor memory device using a word line drive circuit system according to the second embodiment of the present invention wherein one memory cell is emphasized in a memory cell array.
Figure 8:
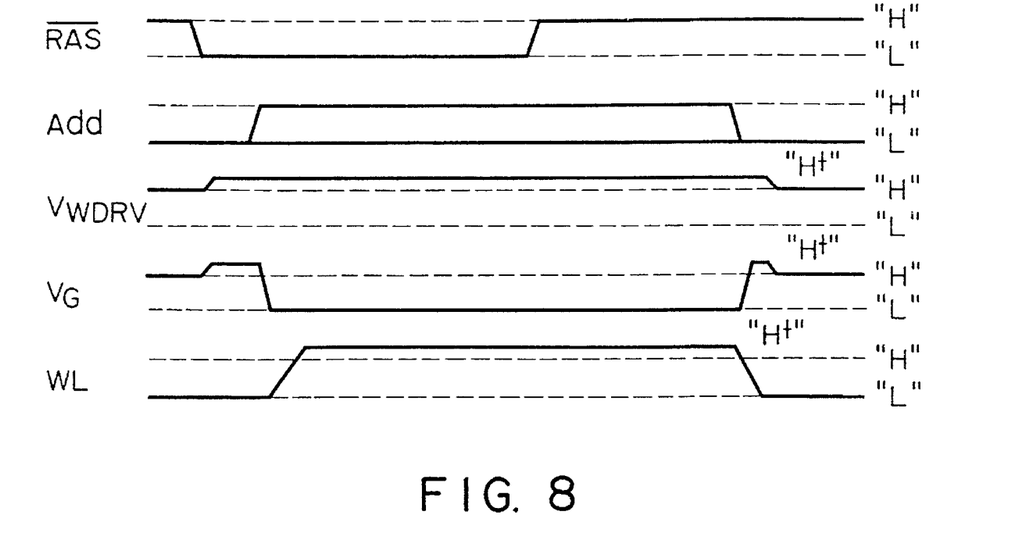
FIGS. 8 and 9 are timing charts of signals in the circuit shown in FIG. 7.

A semiconductor memory device according to the second embodiment of the present invention will be described below with reference to FIGS. 7 to 9. A circuit shown in FIG. 7 is obtained by improving the word line drive circuit 15 in the circuit shown in FIG. 5. That is, in the circuit arrangement shown in FIG. 5, when the word line control circuit 15 is turned on, the gate potential $V_{N1}$ of the MOS transistor 36 cannot reliably satisfy a condition of "$V_{N1} \geq Vcc+V_{TH3}$", and the word line control circuit 15 must be initialized. A circuit for solving this problem without initialization is shown in FIG. 7.

In FIG. 7, a memory cell 10, a word line drive circuit 11, and a NAND circuit 12 are the same parts as in the circuit shown in FIG. 5. Therefore, the same reference numeral as in FIG. 5 denote the same parts in FIG. 7, and a detailed description thereof will be omitted.

The word line potential control circuit 15 is constituted by an inverter 25, a capacitor 26, p-channel MOS transistors 27 and 29, and an n-channel MOS transistor 28. An $\overline{RAS}$ signal is supplied to the input terminal of the inverter 25. The output terminal of the inverter 25 is connected to one electrode of the capacitor 26. The current paths of the MOS transistors 27 and 28 are connected in series between the other electrode of the capacitor 26 and a ground point Vss. The $\overline{RAS}$ signal is supplied to the gates of the MOS transistors 27 and 28. The back gate of the MOS transistor 27 is connected to the other electrode of the capacitor 26. The current path of the MOS transistor 29 is connected between the other electrode of the capacitor 26 and a power source Vcc. The gate of the MOS transistor 29 is connected to the common connection point between the current paths of the MOS transistors 27 and 28, and the back gate of the MOS transistor 29 is connected to the other electrode of the capacitor 26. The other electrode of the capacitor 26 is connected to the sources and back gates of the word line drive transistors 19 and 20.

An operation of the circuit shown in FIG. 7 will be described below with reference to a timing chart of FIG. 8. Note that, assuming that a threshold voltage of a transfer gate transistor 17 of the memory cell 10 is set to be $V_{TH2}$, a potential equal to or higher than Vcc+$V_{TH2}$ is described as "H+" level.

When the $\overline{RAS}$ signal is set at high level (a potential corresponding to the power source Vcc, to be referred to as "H" level hereinafter), i.e., when any memory cell is not accessed, a potential VWDRV applied to the sources and back gates of the word line drive transistors 19 and 20 is kept at "H" level, i.e., the potential of the power source Vcc. When the AS signal goes to low level (a potential corresponding to the ground point Vss, to be referred to as "L" level) to access a memory cell, the source potential $V_{WDRV}$ of the word line drive transistors 19 and 20 is increased to "H+" level by capacitive coupling of the capacitor 26 arranged in the word line potential control circuit 15. A recognized row address Add is supplied to a row decoder, and the output from the NAND circuit 12 corresponding to the row address signal Add in the row decoder goes to "L" level. At this time, a gate potential $V_G$ of the word line drive transistor 20 goes to "L" level. Since the output from the NAND circuit 12 is set at "L" level, a MOS transistor 22 is turned off. As a result, the MOS transistor 20 is turned on, the MOS transistor 19 is turned off, and the potential of a word line WL is increased to "H+" level. Therefore, memory cells of a row connected to the word line WL in the memory cell array MCA is selected, thereby writing or reading data. After the writing or reading operation is finished, when the row address signal Add is changed (at this time, the $\overline{RAS}$ signal already goes to "H" level, the MOS transistor 27 is set in an OFF state, the MOS transistor 28 and 29 are set in an ON state), the output from the NAND circuit 12 goes to "H" level. Therefore, the MOS transistor 20 is turned off, the MOS transistors 2 and 19 are turned on, and the potential of the word line WL returns to "L" level. Since the AS signal is set at "H" level, the potential $V_{WDRV}$ returns to "H" level, i.e., the source potential of the MOS transistors 9 and 20 returns to "H" level.

As described above, in the circuit shown in FIG. 7, since a high voltage of "H+" level is applied to the word line drive transistors 19 and 20 only when memory cells are accessed, degradation of the gate oxide films of the word line drive transistors 19 and 20 can be prevented. In addition, the arrangement of the word line potential control circuit 15 shown in FIG. 7 requires no power-ON initialization in the word line potential control circuit 15.

Figure 9:
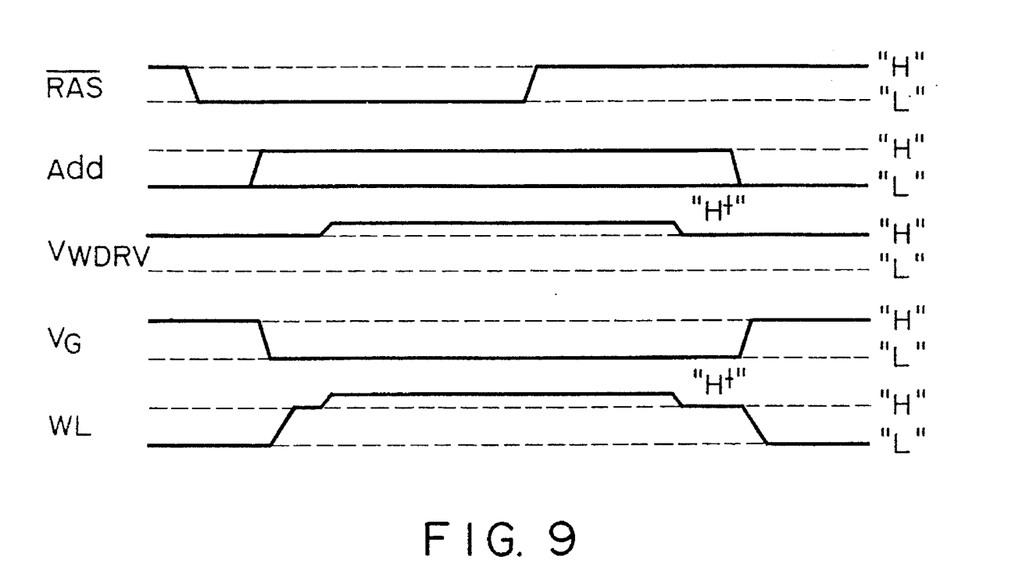

In a DRAM in which the precharge potential of a bit line BL is set to be ½ Vcc and a condition of $V_{TH2}$<Vcc is satisfied, or a DRAM in which the precharge potential of the bit line BL is set to be Vss, as shown in FIG. 9, after the row address signal Add is determined using the delayed $\overline{RAS}$ signal (after the row address signal Add is supplied to the row decoder), the source potential $V_{WDRV}$ of the word line drive transistors 19 and 20 can be increased to "H+" level due to the following reason. In this case, when the row address is determined to increase the potential of the word line WL to Vcc level i.e., "H" level, charges accumulated in the memory cell can be transmitted to the bit line BL and read out, and only the source potential $V_{WDRV}$ of the word line drive transistors 19 and 20 is boosted to "H+" level only when the potential of the power source Vcc is restored in the memory cell. When the above operation is to be performed, the $\overline{RAS}$ signal is preferably input to the inverter 25 through a delay circuit (not shown) or the like.

When no memory cell is selected, the source potential $V_{WDRV}$ of the word line drive transistors 19 and 20 is not necessarily set to be the potential of the power source Vcc. When the source potential $V_{WDRV}$ is set to be equal to or lower than the potential Vcc and equal to or higher than the threshold voltage $V_{TH2}$ of the transfer gate transistor 17, the potential of the word line WL can be instantaneously increased when a memory cell must be accessed.

In addition, in the first and second embodiments, a word line drive transistor is constituted by a p-channel transistor, and a memory cell is constituted by an n-channel MOS transistor and an n-channel MOS capacitor. However, the word line drive transistor may be constituted by an n-channel transistor, and the memory cell may be constituted by a p-channel MOS transistor and a p-channel capacitor. In this case, the conductivity types of the MOS transistors are reversed, and the power source Vcc and the ground point Vss are replaced with each other. When no memory cell is selected, the source potential of the word line drive transistor is set to be the ground potential Vss. When no memory cell is selected, the source potential $V_{WDRV}$ of the word line drive transistor is not necessarily set to be the ground potential Vss. Only when the source potential $V_{WDRV}$ is set to be equal to or higher than the potential Vss and equal to or lower than the threshold voltage of the transfer gate transistor, the potential of the word line can be instantaneously increased when a memory cell must be accessed.

As a degree of integration of a DRAM is higher, power consumption of the DRAM during an operation time is increased. In recent years, the following method has been utilized. That is, a memory cell array is divided in a plurality of blocks, charging and discharging currents of the bit line are restrained by activating only some of the blocks during an operation time, thereby obtaining a DRAM having low power consumption. The third embodiment obtained by employing the present invention to a memory cell using this method will be described below with reference to FIGS. 10 to 12.

Figure 10:
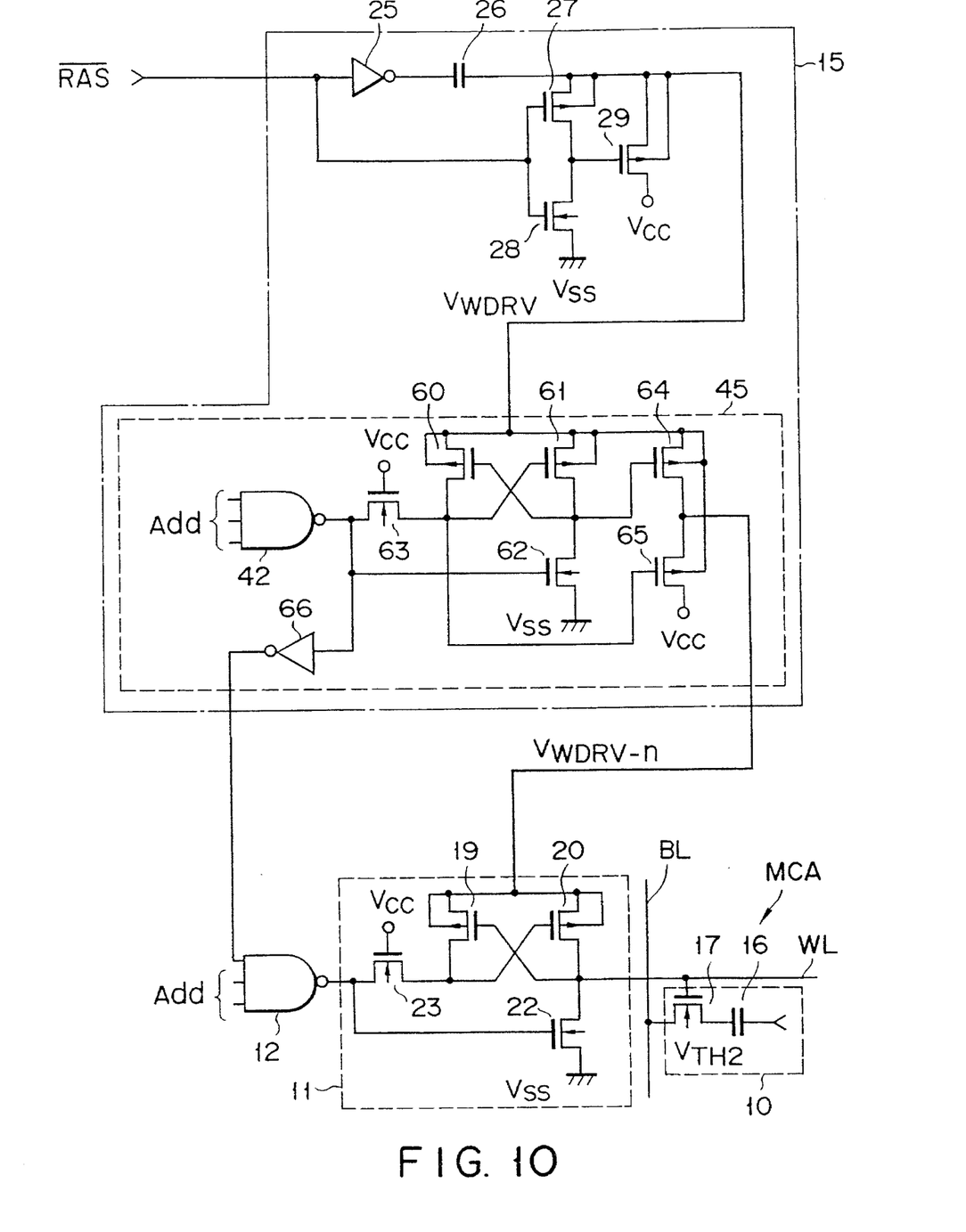
FIG. 10 is a circuit diagram showing a memory cell, a row decoder, and a word line drive circuit in a semiconductor memory device using a word line drive circuit system according to the third embodiment of the present invention wherein one memory cell is emphasized in a memory cell array.

In a circuit shown in FIG. 10, a block activation circuit 45 for selecting one block from a plurality of blocks is added to a word line potential control circuit 15 in the circuit arrangement shown in FIG. 7. The circuit 45 has a function of activating only a block including a memory cell to be accessed. The circuit 45 causes a source potential to increase to "H$^+$" level in only a word line drive transistor included in a memory cell array to be activated.

The block activation circuit 45 is constituted by a NAND circuit 42, p-channel MOS transistors 60, 61, 64, and 65, n-channel MOS transistors 62 and 63, and an inverter 66. An upper-bit row address signal Add is supplied to the NAND circuit 42. The NAND circuit 42 is a part of a row decoder. In FIG. 10, the NAND circuit 42 is included in the circuit 45 for descriptive convenience. The output terminal of the NAND circuit 42 is connected to one end of the current path of the MOS transistor 63. The gate of the MOS transistor 63 is connected to a power source Vcc, and the other end of the current path is connected to the drain of the MOS transistor 60 and the gates of the MOS transistors 61 and 65. The source and back gate of the MOS transistor 60 are connected to the other electrode of a capacitor 26, and the gate of the MOS transistor 60 is connected to the drain of the MOS transistor 61. The source and back gate of the MOS transistor 61 are connected to the other electrode of the capacitor 26, and the drain of the MOS transistor 61 is connected to the drain of the MOS transistor 62 and the gate of the MOS transistor 64. The source of the MOS transistor 62 is connected to a ground point Vss, and the gate of the MOS transistor 62 is connected to the output terminal of the NAND circuit 42. The current paths of the MOS transistors 64 and 65 are connected in series between the sources of the MOS transistor 60 and 61 and the power source Vcc. The back gates of the MOS transistors 64 and 65 are connected to the sources and back gates of the MOS transistors 60 and 61. The sources and back gates of the word line drive transistors 19 and 20 are connected to a common connection point between the current paths of the MOS transistors 64 and 65. The input terminal of the inverter 66 is connected to the output terminal of the NAND circuit 42, and the output terminal of the inverter 66 is connected to one input terminal of a NAND circuit 12.

Figure 11:
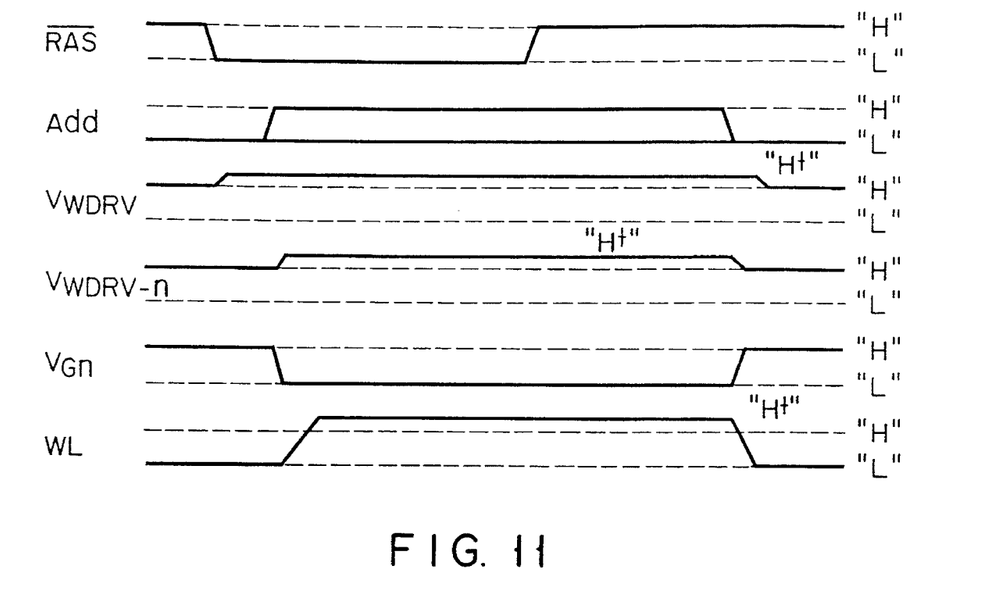
FIGS. 11 and 12 are timing charts of signals in the circuit shown in FIG. 10.

An operation of the circuit shown in FIG. 10 will be described below using a timing chart of FIG. 11. In the following description, the source potentials of the MOS transistors 19 and 20 are set to be $V_{WDRV-n}$, and the source potentials of the MOS transistors 60 and 61 of the block activation circuit 45 are set to be $V_{WDRV}$.

When an $\overline{RAS}$ signal is set at "H" level, i.e., when no memory is accessed, the source potentials $V_{WDRV}$ of the MOS transistors 60 and 61 are kept at "H" level, i.e., the potential of the power source Vcc. As a result, the source potentials $V_{WDRV-n}$ of the word line drive transistors 19 and 20 are kept at "H" level. The $\overline{RAS}$ signal goes to "L" level, and a memory cell is accessed. At this time, since the capacitor 26 is arranged in the word line potential control circuit 15, the potential $V_{WDRV}$ is boosted to "H$^+$" level (in this case, the recognized row address signal Add is supplied to a row decoder, and the potential $V_{WDRV}$ is boosted to "H$^+$" level before the output from the NAND circuit 42 of a row designated by the row address in the row decoder goes to "H$^+$" level).

When the row address signal Add is supplied to the NAND circuit 42 serving as a part of the row decoder, a potential at "H$^+$" level is applied to only a word line drive circuit 11 of a block corresponding to the row address signal Add of all blocks in a memory cell array MCA. That is, only the block corresponding to the row address Add is activated, and no high voltage at "H$^+$" level is applied to word line drive transistors of inactive blocks, thereby preventing degradation of a gate oxide film. In the block selected on the basis of the row address signal Add, the output of the NAND circuit 12 goes to "L" level, and a gate potential $V_{Gn}$ of the word line drive transistor 20 goes to "L" level. As a result, the MOS transistor 20 is turned on, and the MOS transistors 22 and 19 are turned off, thereby increasing the potential of a word line WL to "H$^+$" level. Thus, the memory cells of the row connected to the word line WL in the selected block are selected, thereby writing and reading data. After the writing or reading operation is finished, when the row address signal Add is changed (at this time, the $\overline{RAS}$ signal is already set at "H" level, a MOS transistor 27 is OFF, the MOS transistor 28 is ON, and the MOS transistor 29 is ON), the output of the NAND circuit 12 goes to "H" level. Therefore, the MOS transistor 20 is turned off, and the MOS transistors 22 and 19 are turned on, thereby returning the potential of the word line WL to "L" level. The potential $V_{WDRV}$ goes to "H" level by setting the $\overline{RAS}$ signal at "H" level, and the potential $V_{WDRV-n}$, i.e., the source potentials of the MOS transistors 19 and 20 are returned to "H" level.

In the circuit shown in FIG. 10, a potential at "H$^+$" level is applied to the word line drive transistors 19 and 20 in the selected block through the block activation circuit 45. For this reason, no potential of "H$^+$" level is applied to word line drive transistors of inactivated blocks. Therefore, degradation of a gate oxide film can be effectively prevented.

Figure 12:
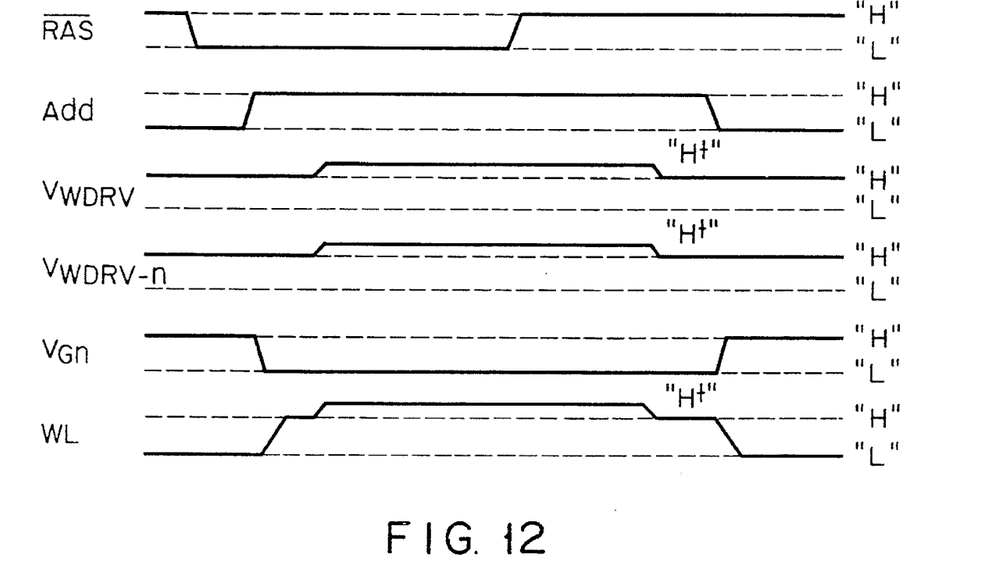

In a DRAM in which the precharge potential of a bit line BL is set to be ½ Vcc and a condition of $V_{TH2}$<Vcc is satisfied, or a DRAM in which the precharge potential of the bit line BL is set to be Vss, when the $\overline{RAS}$ signal is delayed by a delay circuit (not shown) to be supplied to an inverter 25 and the gates of the MOS transistors 27 and 28, as shown in a timing chart of FIG. 12, after the row address signal Add is determined, the source potential $V_{WDRV-n}$ of the word line drive transistors 19 and 20 can be boosted to "H$^+$" level.

when no memory cell is selected, the source potential $V_{WDRV-n}$ of the word line drive transistors 19 and 20 or the source potential $V_{WDRV}$ of the MOS transistors 60 and 61 of the block activation circuit 45 is not necessarily set to be the power source voltage Vcc. When these source potentials are set to be equal to or lower than the potential of power source Vcc and equal to or higher than the threshold voltage $V_{TH2}$ of a transfer gate transistor 17, the potential of the word line WL can be instantaneously increased when a memory cell must be accessed.

In the circuit shown in FIG. 10, a word line drive transistor is constituted by a p-channel MOS transistor, and a memory cell is constituted by an n-channel MOS transistor and an n-channel MOS capacitor. However, as in the first and second embodiments, the word line drive transistor may be constituted by an n-channel MOS transistor, and the memory cell may be constituted by a p-channel MOS transistor and a p-channel MOS capacitor. In this case, when no memory cell is selected, the source potential of the word line drive transistor is set to be the ground potential Vss. In this case, when no memory cell is selected, the source potential $V_{WDRV-n}$ of the word line drive transistor is not necessarily set to be the ground potential Vss. When the source potential $V_{WDRV-n}$ is set to be equal to or higher than the ground potential Vss and equal to or lower than the threshold voltage of the transfer gate transistor, the potential of the word line can be instantaneously increased when a memory cell must be accessed.

Figure 13:
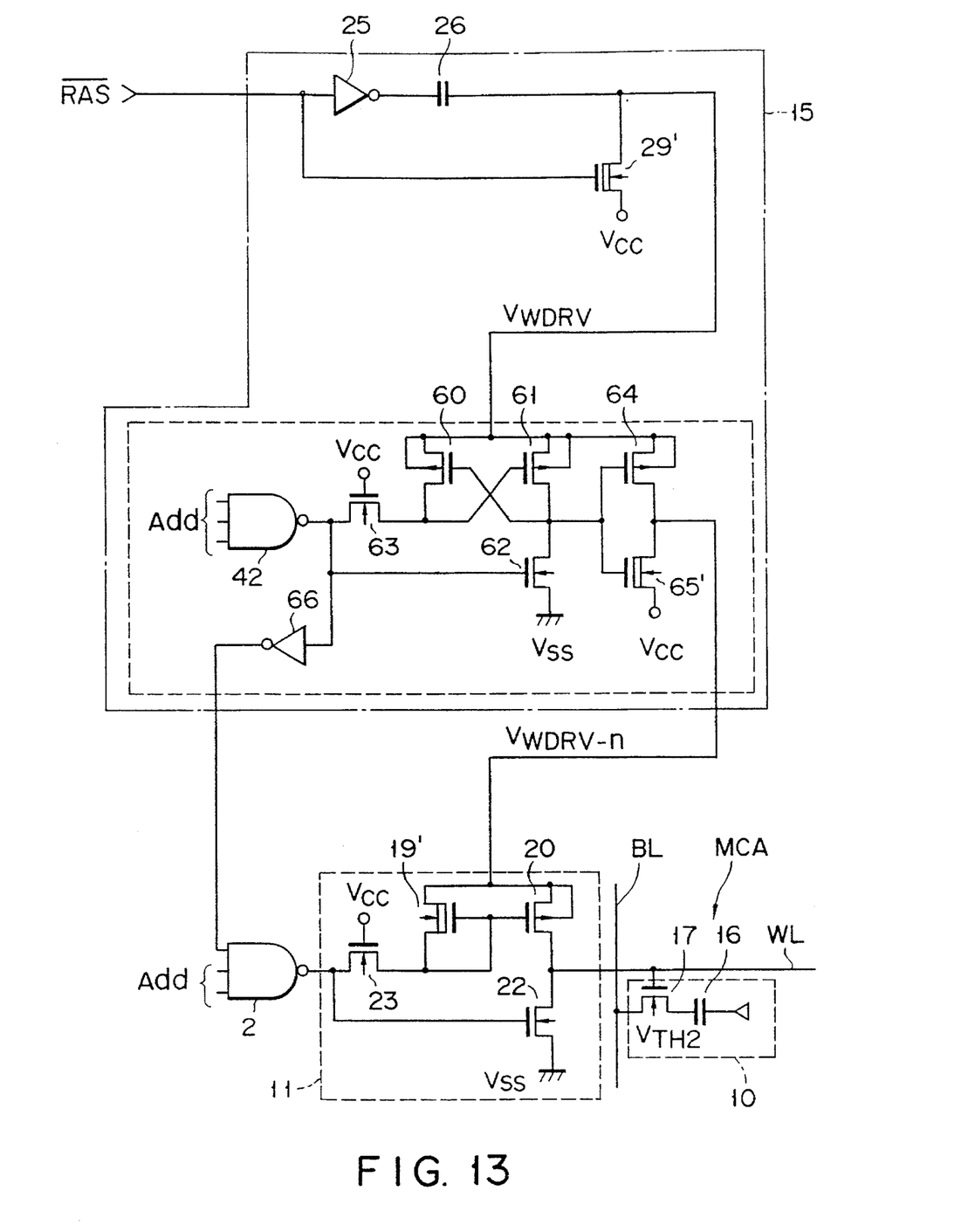
FIG. 13 is a circuit diagram showing a memory cell, a row decoder, and a word line drive circuit in a semiconductor memory device using a word line drive circuit system according to the fourth embodiment of the present invention wherein one memory cell is emphasized in a memory cell array.

The present invention is not limited to the first to third embodiments, and various modifications may be effected. For example, as shown in FIG. 13, D (Depletion) n-channel MOS transistors 49', 59' and 65' can be used in place of the p-channel MOS transistors 29, 65, and 19 in the circuit shown in FIG. 10. When a D MOS transistor 29' is used, the MOS transistors 27 and 28 are not required.

Figure 14:
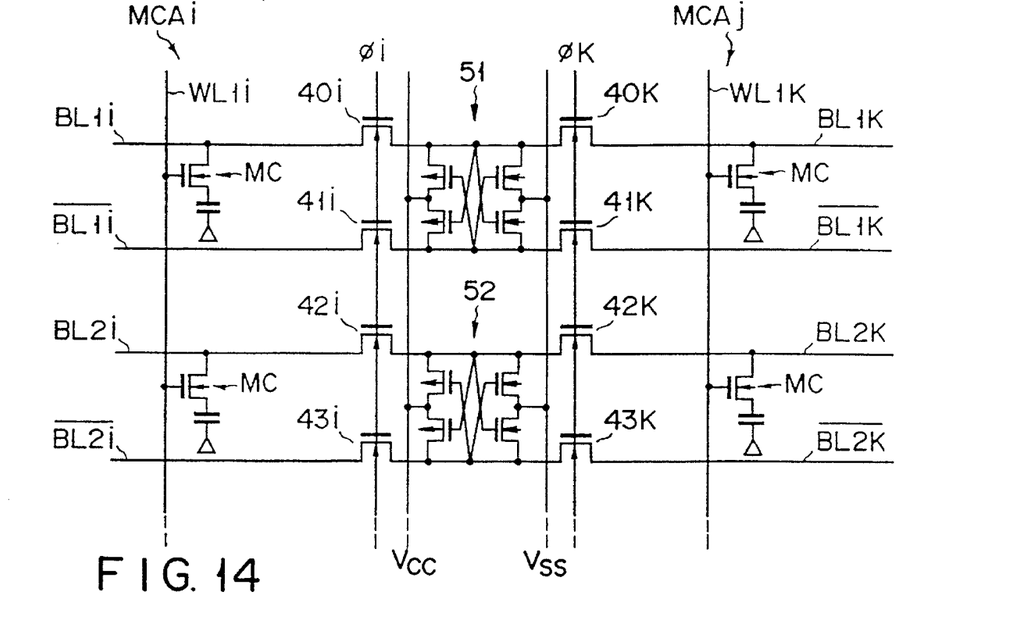
FIGS. 14 and 15 are circuit diagram showing an application of the present invention to another circuit.
Figure 15:
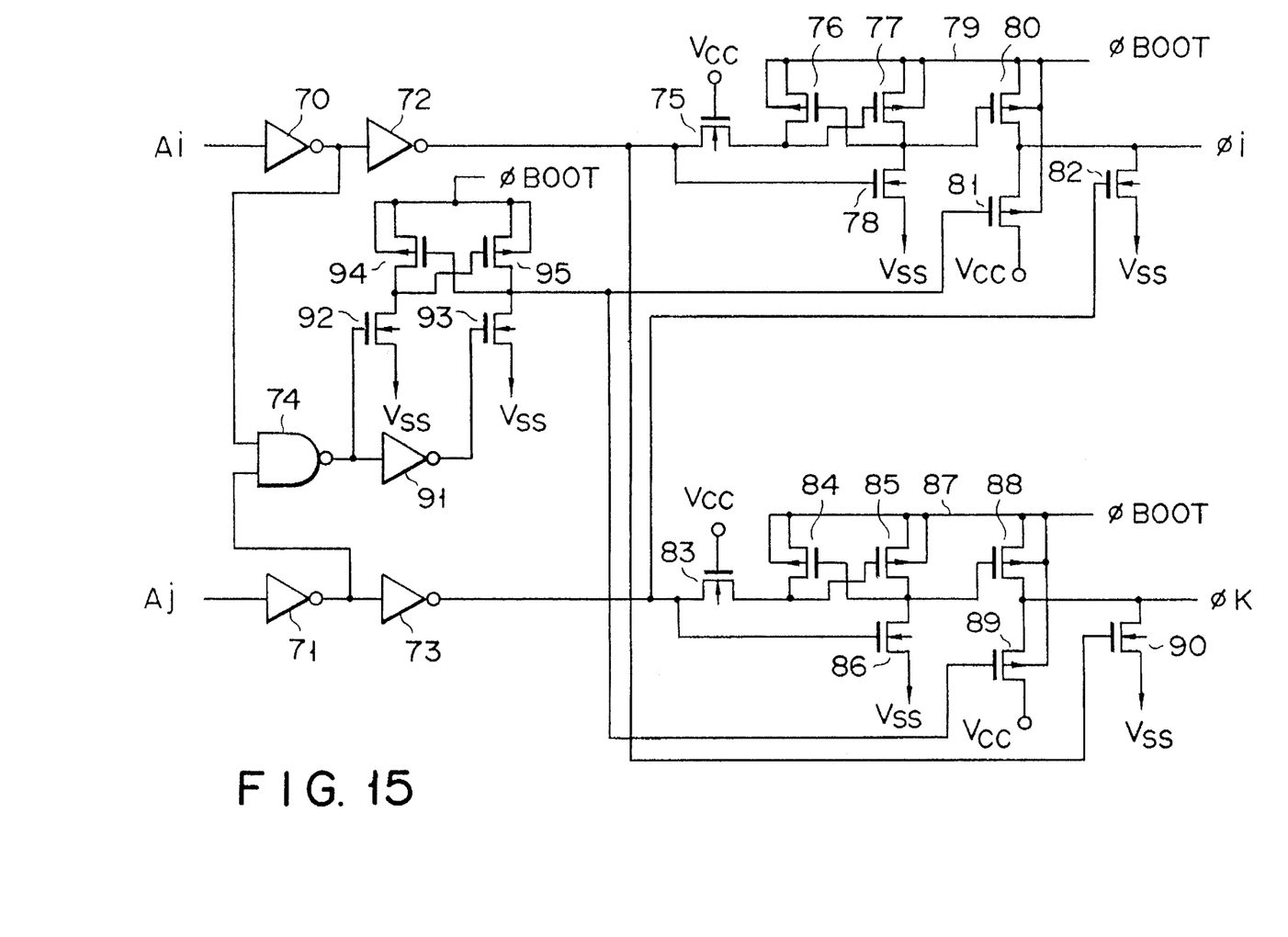
Figure 16:
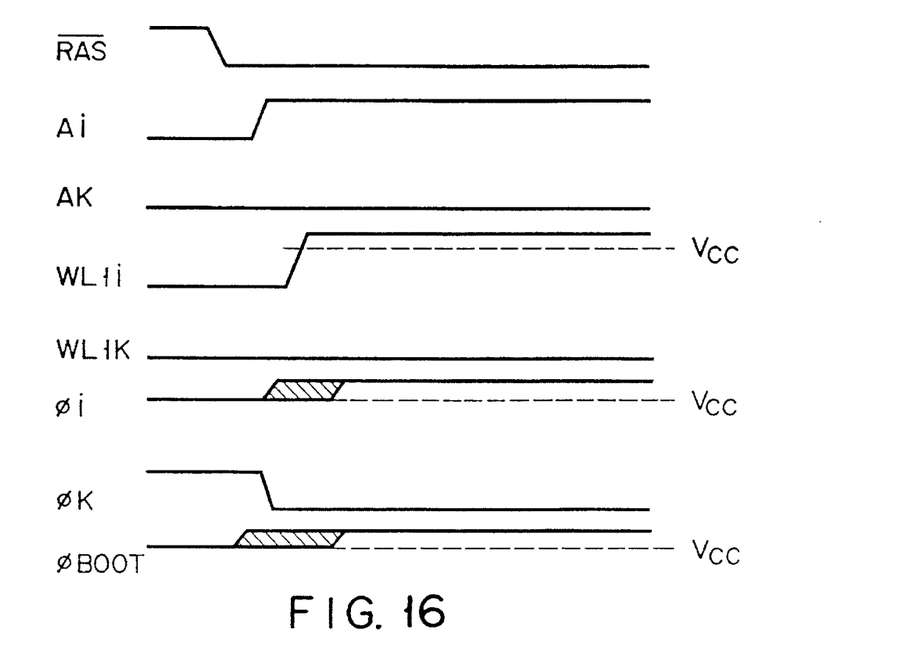
FIG. 16 is a timing chart explaining the operations of the circuits shown in FIGS. 14 and 15.

FIGS. 14 to 16 show applications of the present invention. Circuits shown in FIGS. 14 and 15 are obtained by applying the present invention to a DRAM using a shared sense amplifier system. In the shared sense amplifier system, a memory cell array is generally divided into two parts, and a sense amplifier S/A is arranged between memory cell arrays MCAi and MCAj. That is, the current paths of switching n-channel MOS transistors 40i and 40k are connected in series between bit lines BL1i and BL1k, and the current paths of switching n-channel MOS transistors 41i and 41k are connected in series between bit lines $\overline{BL1i}$ and $\overline{BL1k}$. One input terminal of a sense amplifier 51 is connected to the connection point between the current paths of the MOS transistors 40i and 40k, and the other input terminal of the sense amplifier 51 is connected to the connection point between the current paths of the MOS transistors 41i and 41k. Similarly the current paths of switching n-channel MOS transistors 42i and 42k are connected in series between bit lines $\overline{BL2i}$ and $\overline{BL2k}$, and the current paths of switching n-channel MOS transistors 43i and 43k are connected in series between bit lines $\overline{BL2i}$ and $\overline{BL2k}$. One input terminal of a sense amplifier 52 is connected to the connection point between the current paths of the MOS transistors 42i and 42k, and the other input terminal of the sense amplifier 52 is connected to the connection point between the current paths of the MOS transistors 43i and 43k. Memory cells MC each having an n-channel MOS transistor and an n-channel MOS capacitor are arranged at the intersections between the bit lines BL1i, BL1k, $\overline{BL1i}$, $\overline{BL1k}$, BL2i, BL2k, $\overline{BL2i}$, and $\overline{BL2k}$ and word lines WLi and WLj. A control signal φi is supplied to the gates of the MOS transistors 40i, 41i, 42i, and 43i, and a control signal φk is supplied to the gates of the MOS transistors 40k, 41k, 42k, and 43k.

FIG. 15 shows a generating circuit for generating the control signals φi and φk in the circuit shown in FIG. 14. This circuit ON/OFF-controls the switching MOS transistors 40i, 41i, 42i, 43i, 40k, 41k, 42k, and 43k so as to selectively connect the sense amplifiers 51 and 52 to the bit lines BL1i, $\overline{BL1i}$, BL2i, and $\overline{BL2i}$ on the memory cell array MCAi side or to the bit lines BL1k, $\overline{BL1k}$, BL2k, and $\overline{BL2k}$ on the memory cell array MCAk side. Address signals Ai and Aj are supplied to the input terminals of inverters 70 and 71, respectively. The output terminal of the inverter 70 is connected to the input terminal of an inverter 72 and one input terminal of a NAND circuit 74. The output terminal of the inverter 71 is connected to the input terminal of an inverter 73 and the other input terminal of the NAND circuit 74. The output terminal of the inverter 72 is connected to one end of the current path of an n-channel MOS transistor 75 having a gate connected to a power source Vcc. The other end of the current path of the MOS transistor 75 is connected to one end of the current path of a p-channel MOS transistor 76 and the gate of a p-channel MOS transistor 77. One end of the current path of the MOS transistor 77 is connected to the gate of the MOS transistor 76 and one end of the current path of an n-channel MOS transistor 78. The other end of the current path of the MOS transistor 78 is connected to a ground point Vss, and the gate of the MOS transistor 78 is connected to the output terminal of the inverter 72. The other end of each of the current paths and back gates of the MOS transistors 76 and 77 are connected to a signal line 79 receiving a boost signal (a level obtained by adding a threshold voltage $V_{TH4}$ of the switching MOS transistors 40i to 43i and 40k to 43k to the power source voltage Vcc) $\phi_{BOOT}$. The current paths of p-channel MOS transistors 80 and 81 are directly connected between the signal line 79 and the power source Vcc. The back gates of the MOS transistors 80 and 81 are connected to the signal line 79. The gate of the MOS transistor 80 is connected to the connection point between the current paths of the MOS transistors 77 and 78. The current path of an n-channel MOS transistor 82 is connected between the connection point between the current paths of the MOS transistors 80 and 81 and the ground point Vss, and the gate of the MOS transistor 82 is connected to the output terminal of the inverter 73.

The output terminal of the inverter 73 is connected to one end of the current path of an n-channel MOS transistor 83 having a gate connected to the power source Vcc. The other end of the current path of the MOS transistor 83 is connected to one end of the current path of a p-channel MOS transistor 84 and the gate of a p-channel MOS transistor 85. One end of the current path of the MOS transistor 85 is connected to the gate of the MOS transistor 84 and one end of the current path of an n-channel MOS transistor 86. The other end of the current path of the MOS transistor 86 is connected to the ground point Vss, and the gate of the MOS transistor 86 is connected to the output terminal of the inverter 73. The other end of each of the current paths and back gates of the MOS transistors 84 and 85 are connected to a signal line 87 for receiving the boost signal $\phi_{BOOT}$. The current paths of p-channel MOS transistors 88 and 89 are directly connected between the signal line 87 and the power source Vcc. The back gates of the MOS transistors 88 and 89 are connected to the signal line 87. The gate of the MOS transistor 88 is connected to the connection point between the current paths of the MOS transistors 85 and 86. The current path of an n-channel MOS transistor 90 is connected between the connection point between the current paths of the MOS transistors 88 and 89 and the ground point Vss, and the gate of the MOS transistor 90 is connected to the output terminal of the inverter 72.

The output terminal of the NAND circuit 74 is connected to the input terminal of an inverter 91 and the gate of an n-channel MOS transistor 92. The output terminal of the inverter 91 is connected to the gate of an n-channel MOS transistor 93. One end of the current path of the MOS transistor 92 is connected to the ground point Vss, and the other end is connected to one end of the current path of a p-channel MOS transistor 94 and the gate of a p-channel MOS transistor 95. One end of the current path of the MOS transistor 93 is connected to the ground point Vss, and the other end is connected to one end of the current path of the MOS transistor 95 and the gate of the MOS transistor 94. The boost signal $\phi_{BOOT}$ is supplied to the other ends of the current paths and back gates of the MOS transistors 94 and 95. The connection point between the current paths of the MOS transistors 93 and 95 is connected to the gates of the MOS transistors 81 and 89.

The control signal $\phi i$ is output from the connection point between the current paths of the MOS transistors 80 and 81, and the control signal $\phi k$ is output from the connection point between the current paths of the MOS transistors 88 and 89.

FIG. 16 is a timing chart for explaining operations of the circuits shown in FIGS. 14 and 15 wherein the memory cell MC on the memory cell array MCAi is selected as an example. When an $\overline{RAS}$ signal goes to "L" level and an address signal Ai rises to "H" level (an address signal Ak is set at "L" level), since an output from the inverter 72 is set at "H" level, the MOS transistors 76 and 78 are turned on, and the MOS transistor 77 is turned off. Therefore, the MOS transistor 80 is turned on. Since address signals Ai and Aj are set at "H" level and "L" level, respectively, an output from the NAND circuit 74 goes to "H" level, and an output from the inverter 91 goes to "L" level. At this time, the MOS transistor 92 is turned on, and the MOS transistor 93 is turned off. Since the connection point between the current paths of the MOS transistors 93 and 95 goes to the level of the boost signal $\phi_{BOOT}$, the MOS transistor 81 is turned off. When the address signal Aj goes to "L" level, the output from the inverter 73 goes to "L" level, and the MOS transistor 82 is turned off. As a result, the control signal $\phi i$ has the same potential as the boost signal $\phi_{BOOT}$.

Since an output from the inverter 73 is set at "L" level, the MOS transistor 85 is turned on, the MOS transistors 84 and 86 are turned off, and then the MOS transistor 88 is turned off. The MOS transistor 89 is turned off, since the connection point between the current paths of the MOS transistors 93 and 95 is set at the same level as that of the signal $\phi_{BOOT}$. Since an output from the inverter 72 is set at "H" level, the MOS transistor 90 is turned off. Therefore, the control signal $\phi k$ goes to "L" level.

In contrast to this, when the address signal Ai is set at "L" level and the address signal Ak is set at "H" level, the control signal $\phi i$ goes to "L" level, and the control signal $\phi k$ has the same potential as the boost signal $\phi$BOOT.

When the address signals Ai and Aj are set at "L" level, an output from the NAND circuit 74 goes to "L" level, and an output from the inverter 91 goes to "H" level. At this time the MOS transistor 92 is turned off, and the MOS transistor 93 is turned on. As a result, the MOS transistor 95 is turned off, the MOS transistor 94 is turned on, and the potential of the connection point between the MOS transistors 93 and 95 goes to Vss level. Therefore, the MOS transistors 81 and 89 are turned ON. At this time, since the MOS transistors 80, 82, 88, and 90 are turned off, the control signals $\phi i$ and $\phi k$ go to "H" level (Vcc level).

As described above, in the circuit shown in FIG. 15, in response to the address signals Ai and Aj, a potential at "Vcc+$V_{TH4}$" level and a potential at Vss level are applied to the gates of the switching MOS transistors on the selected memory cell array side and to the gates of the switching MOS transistors on the non-selected memory cell array, respectively. When both the memory cell arrays are not selected, the gates of the switching MOS transistors on both the sides of the sense amplifier.

with the above arrangement, the power source voltage Vcc, the voltage "Vcc+$V_{TH4}$" ($V_{TH4}$ is the threshold voltage of the MOS transistors 40$i$ to 43$i$ and 40$k$ to 43$k$), and the potential of the ground point Vss can be selectively applied to the gates of the switching MOS transistors 40$i$ to 43$i$ and 40$k$ to 43$k$. Therefore, decreases in potentials of bit lines BL1$i$, $\overline{BL1i}$, BL2$i$, $\overline{BL1k}$, BL1$k$, $\overline{BL1k}$, BL2$k$, and $\overline{BL2k}$ by the threshold voltage $V_{TH4}$ of the MOS transistors 40$i$ to 43$i$ and 40$k$ to 43$k$ can be prevented, and the potential of the bit line can be set at Vcc level when a memory cell is selected. In addition, since a high potential "Vcc+$V_{TH4}$" is applied to the gates of the MOS transistors 40$i$ to 43$i$ and 40$k$ to 43$k$ only when the memory cell is selected, degradation of the gate insulating films of the MOS transistors 40$i$ to 43$i$ and 40$k$ to 43$k$ can be minimized.

What is claimed is:

1. A signal control circuit for generating an output potential comprising:

a signal line for receiving a first potential and a second potential obtained by boosting the first potential;

a first capacitor for receiving a first input signal at a first electrode;

a first MOS transistor of a conductivity type having a first current terminal and a control gate connected to a first potential supplying source for supplying a third potential, and a second current terminal connected to a second electrode of said first capacitor;

a second capacitor for receiving a second input signal at a first electrode, and having a second electrode connected to said signal line;

a second MOS transistor of the conductivity type having a first current terminal connected to the first potential supplying source, a second current terminal connected to said signal line, and a control gate connected to a connection point between said second electrode of said first capacitor and said second current terminal of said first MOS transistor; and a third MOS transistor of the conductivity type having a first current terminal and a control gate connected to the first potential supplying source and a second current terminal connected to said signal line.

2. A circuit according to claim 1, wherein the second input signal is the first input signal inverted.

3. A signal control circuit for generating an output potential comprising:

a signal line for receiving a first potential and a second potential obtained by boosting the first potential;

a depletion MOS transistor having a control gate for receiving a first input signal, a first current terminal connected to a first potential supplying source for supplying a third potential, and a second current terminal connected to said signal line; and a capacitor having a first electrode for receiving a second input signal and a second electrode connected to said signal line.

4. A circuit according to claim 3, wherein the second input signal is the first input signal inverted.

* * * * *